United States Patent [19]

Tyler et al.

[11] 4,413,252
[45] Nov. 1, 1983

[54] CAPACITIVE SWITCH AND PANEL

[75] Inventors: Hugh J. Tyler, Santa Ana, Calif.; William H. Conway, Midlothian, Va.

[73] Assignee: Robertshaw Controls Company, Richmond, Va.

[21] Appl. No.: 132,390

[22] Filed: Mar. 21, 1980

Related U.S. Application Data

[60] Division of Ser. No. 114,596, Jan. 23, 1980, which is a continuation of Ser. No. 932,086, Aug. 8, 1978, abandoned.

[51] Int. Cl.³ ............................ G06F 3/02; H01H 1/06
[52] U.S. Cl. ......................... 340/365 C; 200/DIG. 1; 200/159 B; 200/5 A; 200/275; 219/10.55 R; 361/280; 361/288; 361/303
[58] Field of Search ............. 340/365 C; 200/DIG. 1, 200/2, 52 R, 5 A, 159 B, 275; 307/98, 99, 116; 361/280, 281, 303, 330, 288; 219/10.55 B, 10.55 R

[56] References Cited

U.S. PATENT DOCUMENTS

| 2,634,315 | 4/1953 | Allison et al. | 361/330 |
| 3,492,440 | 1/1970 | Cerbone et al. | 340/365 C |
| 3,819,906 | 6/1974 | Gould | 340/365 C |
| 3,821,617 | 6/1974 | Shelby et al. | 361/303 |
| 3,886,539 | 5/1975 | Gould | 340/365 C |
| 3,921,167 | 11/1975 | Fox | 340/365 C |
| 3,951,250 | 4/1976 | Pointon et al. | 340/365 C |
| 3,974,472 | 8/1976 | Gould | 340/365 C |
| 4,056,699 | 11/1977 | Jordan | 200/5 A |
| 4,123,631 | 10/1978 | Lewis | 340/365 C |
| 4,293,987 | 10/1981 | Gottbreht et al. | 200/DIG. 1 |
| 4,304,976 | 12/1981 | Gottbreht et al. | 200/DIG. 1 |

OTHER PUBLICATIONS

American Microsystems Inc., "Touch Control for Capacitance Switching".

Primary Examiner—James J. Groody

[57] ABSTRACT

A user, touch actuable capacitive switch for changing the level of an output signal to an electrical circuit. The switch includes an external, user touchable capacitive plate formed on a first dielectric panel and two internal capacitive plates formed on a second dielectric panel affixed to the first flexible dielectric panel, the two internal capacitive plates being oppositely disposed from said external capacitive plate on opposite sides of said second dielectric panel. Electrically conductive paths on the second dielectric panel interconnect the internal capacitive plates to the electrical circuit. A trim tab formed on the second dielectric panel permits the adjustment of the change of level of the output signal upon actuation of the capacitive switch.

2 Claims, 18 Drawing Figures

CAPACITIVE SWITCH AND PANEL

This application is a divisional of U.S. pat. application Ser. No. 114,596 filed Jan. 23, 1980 which was a continuation of U.S. pat. application Ser. No. 932,086 filed Aug. 8, 1978 now abandoned.

BACKGROUND OF THE INVENTION

In co-pending United States Patent Application filed May 11, 1978, Ser. No. 905,061, entitled CONTROL PANEL AND SYSTEM and of which the inventors herein are also co-inventors, a capacitive touch entry switch and panel is disclosed in which certain of the capacitive plates and interconnecting electrical circuits are formed on a flexible sheet of non-conductive material attached to a dielectric panel that forms a part of each capacitive switch.

PRIOR ART STATEMENT

U.S. Pat. Nos. 3,819,906, 3,886,539, 3,974,472 and 4,056,699 all disclose capacitive entry touch panels for use in electronic control systems for appliances. The operation of commercially available, touch actuable capacitance switching systems such as those manufactured by American Microsystems, Inc. of 3800 Homestead Road, Santa Clara, Ca. are described in detail in a sixteen page Application Note published by the same company. Copies of all of the above prior art are enclosed.

As can be seen, the patented devices disclosed in the Prior Art Statement suffer with the disadvantage of having all internal capacitive sense and drive pads directly disposed on the back of the glass or dielectric panel. In such designs this in turn requires the use of spring-like, conductive fingers for frictionally engaging the pads in order to connect the capacitive switches into the electronic logic and control circuitry.

In addition to the above noted prior art, U.S. Pat. No. 3,728,501 which issued Apr. 17, 1973 discloses a fringe type capacitive switch including interdigital capacitive plate elements. U.S. Pat. No. 4,035,795 which issued July 12, 1975, discloses a capacitive switch touch keyboard in which the switch elements are disposed on a glass panel while U.S. Pat. No. 3,971,013 which issued July 20, 1976, discloses a touch keyboard arrangement in which touch keys are disposed on a sheet of flexible dielectric.

SUMMARY OF THE INVENTION

A feature of this invention is to print, etch, silk screen or otherwise form on a sheet of non-conductive plastic all internal, electrically conductive capacitive plates and all electrical connections therewith as required to provide a touch entry, capacitive switching means. Preferably the sheet is formed of a flexible mylar tape or the like.

With this arrangement, all internal capacitive plates and connecting conductive paths can be selectively disposed on the same or opposite sides of the tape which is secured to the backside of the dielectric panel by means of a suitable, nonconductive adhesive. By disposing the internal capacitive plates on opposite sides of the flexible tape, cross overs of connecting conductive paths or circuits that would otherwise be required if all internal capacitive plates were on the same side of the tape are avoided.

In either arrangement, a portion of the flexible tape may be used as a flexible connector cable for bringing out the electrical circuits to interconnect the capacitive switching means with a plug type connector to any required electronic logic display, and control circuitry. Limiting resistors for preventing damage from current surges resulting from static charge buildup and other active circuit components may also be formed on the flexible tape, as well as portions of and electrical connections to the Mode and Temperature selectors also mounted on the touch panel.

To further simplify the design and arrangement of the connecting electrical circuits, the flexible tape may be formed of two or more flexible webs secured together by a non-conductive adhesive. One or more internal capacitive pads or segments forming same may be disposed on two or more sides of the plurality of sides of the respective webs forming the flexible tape.

In addition to serving as a flexible electrical connector cable and support for the internal capacitive pads, the tape, when affixed to the panel, strengthens it permitting the use of a thinner dielectric panel. This is of advantage in the design of the capacitive entry switch itself. The flexible tape, which may be of mylar of other plastic, is shatter proof and protects against the dangers arising from an accidental breaking or cracking when the panel is made of glass. This is of importance, permitting the use of less expensive, untempered glass if desired.

Openings may be formed in the flexible backing tape, if not transparent, to permit visual observation of any displays mounted behind the transparent panel. The color of the flexible tape backing may be chosen to enhance the coloring and display of printed or other indicia on the front of the panel. Also, to protect all or portions of the necessary indicia identifying the external touch entry plates for wear and fading caused by use and cleaning, such may be painted or otherwise applied to the inside of the panel or to the tape. Yet another object of this invention is to provide a flexible capacitive switch and panel and methods of making and using same in which all of the capacitive plates of one or more capacitive switches comprising a keyboard panel and a cable for connecting the panel to a separate electronic circuit means responsive to the actuation of the switches are all disposed on a flexible, dielectric tape. The switches may be either conductively or capacitively coupled to ground when touched and actuated. The tape may be formed of one or more sheets or films of mylar or the like.

The resulting unitary, flexible capacitive touch panel may be used by supporting the same upon any suitable means that avoids electrical contact with the capacitive plates and interconnecting circuitry.

BRIEF DESCRIPTION OF THE DRAWINGS

The objects and advantages of the invention will be understood from the following description when read in view of the appended drawings wherein.

BRIEF DESCRIPTION OF THE INVENTION

Figures 1, 2, 3:
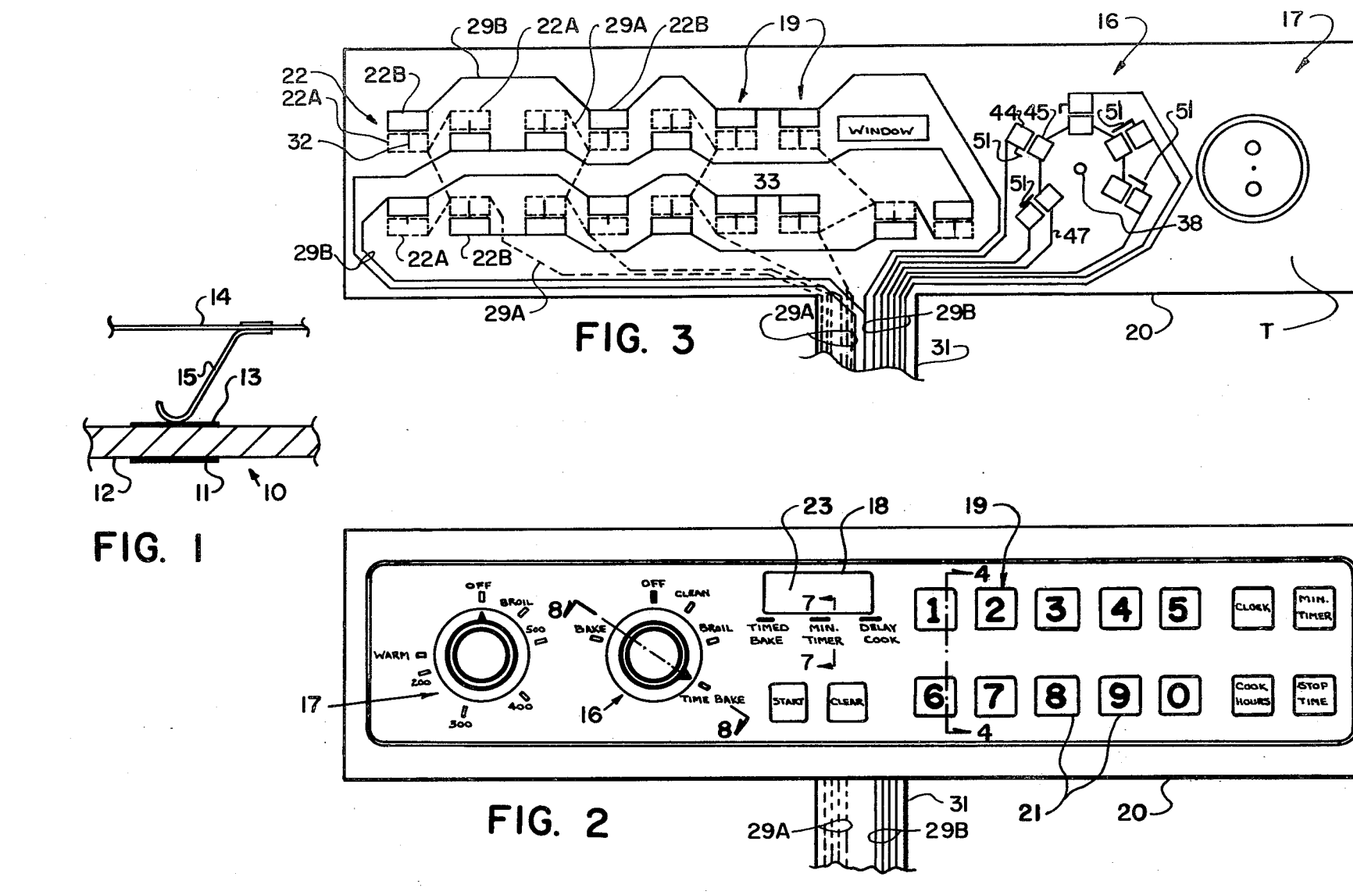
FIG. 1 is a cross-sectional view illustrating a conventional capacitive, touch entry switching panel including a spring contact for connecting an internal capacitive plate to an electrical circuit.
FIG. 2 is a front view of a touch panel including external, user touchable, capacitive switching plates and manually operable, Mode and Temperature Selector Switches in accordance with a preferred embodiment of the invention.
FIG. 3 is a rear view of the touch panel shown in FIG. 2 illustrating a portion of the Mode Selector Switch being removed and the internal capacitive plates each comprising one or more segments associated with a respective external capacitive switching plate and interconnecting conductive paths all being disposed on a flexible backing tape.

Referring to the drawings, FIG. 1 generally illustrates a partial, cross-sectional view of a conventional touch capacitive switch generally designated by the reference numeral 10 as employed in a touch entry control panel as shown in the Prior Art Statement.

As shown, the conventional capacitive switch 10 is typically formed by depositing a user touchable, tin oxide plate 11 on the front of a glass panel 12 and an internal, electrically conductive plate 13 directly opposite the external plate on the inside of the glass panel. Glass being a dielectric material, the two plates 11 and 13 from the plates of a capacitor so that a signal applied to the internal plate 13 is typically loaded to ground when the associated external plate 11 is touched by a user.

This touching of the plate 11 causes a change in the level of an output signal that is sensed and utilized by electronic logic display and control circuitry represented by the printed circuit board 14. The PR limited circuit board 14 is electrically connected to the internal capacitive plate 13 by means of a curved, electrically conductive spring 15 which frictionally engages the segment. This type of electrical connection is subject to the environment behind the panel 12 and all the attendant disadvantages in positioning the spring 15, the variations in spring force, and physical dimensions of the circuit elements among other disadvantages.

The principles of operation of capacitive, touch entry switching panels and systems are described in detail in the aforementioned Prior Art Statement. Commercially available capacitive switching circuits for similar touch entry capacitive switch panels are the Series S9260 through S9266 sold by the American Microsystems, Inc., 3800 Homestead Road, Santa Clara, California 95051.

PREFERRED EMBODIMENT

FIGS. 2-4, 7, 8 and 11 illustrate a preferred embodiment of the invention as generally including a Mode Selector Switch 16, a Temperature Selector Switch 17, an electronic digital display 18, and a plurality of capacitive touch entry switches 19 arranged as a keyboard on a rigid or flexible control and display panel 20 formed of any suitable dielectric material.

KEYBOARD

Each capacitive, touch entry switching means 19 may include an external, suitably identified user touchable, surface portion or a distinct, electrically conductive capacitive plate 21 on the front or outside of the glass panel 20 and an internal capacitive plate 22 disposed opposite the identified surface portion external plate 21 at the back or inside of the glass panel 20. The operation of the switching means is the same as the touching of the surface portion of the dielectric panel by a user completes and actuates the switch as will be explained.

Preferably, external capacitive plates 21 (sixteen in this arrangement) may be formed on the front side of the dielectric panel 20 by depositing a thickness of electrically conductive material such as tin oxide or the like directly upon a clear glass surface or one coated with a non-conductive paint applied for the purpose of coloring the panel exterior and adding identifying indicia to the respective external capacitive plates 21. Plates 0-9 permit digital program entry into electronic logic, display, and control circuitry while the Start, Clear, Clock, Minute Timer, Cook Hours and Stop Time provide for the identified functions as will be described.

Figure 11:
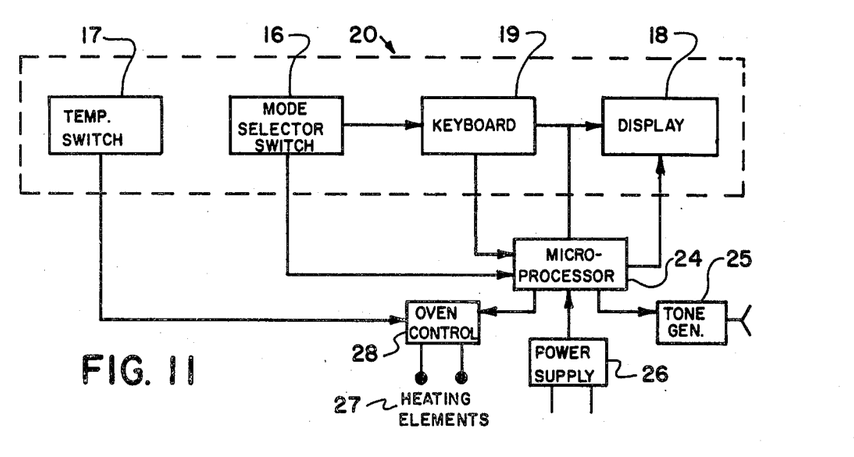
FIG. 11 is an electrical schematic illustrating a preferred embodiment of the invention arranged as an electric oven control system and panel.

A transparent window is provided to permit visual observation of the display 18 typically mounted on a printed circuit board 23 that permits electrical connection to the electronic logic and control circuitry-microprocessor 24 as shown in FIG. 11. Upon the entry of each key stroke, the microprocessor 24 drives the tone generator 25 to signify the same. The AC power supply to the heating elements 27 is regulated by the oven temperature control 28. The microprocessor 24 providing the logic and system of programmed operation may be the commercially available AMI S-2000, N-MOS, 4 bit microprocessor sold by AMI, 3800 Homestead Road, Santa Clara, California.

A novel feature of the preferred embodiment of the invention resides in the manner in which the internal capacitive plates 22, and all or a portion of the required active circuit elements and circuit connections to the panel 20 are provided on a non-electric, flexible sheet or tape T of mylar or the like affixed to the dielectric panel 20 which may be rigid or flexible.

Figures 4, 7, 8:
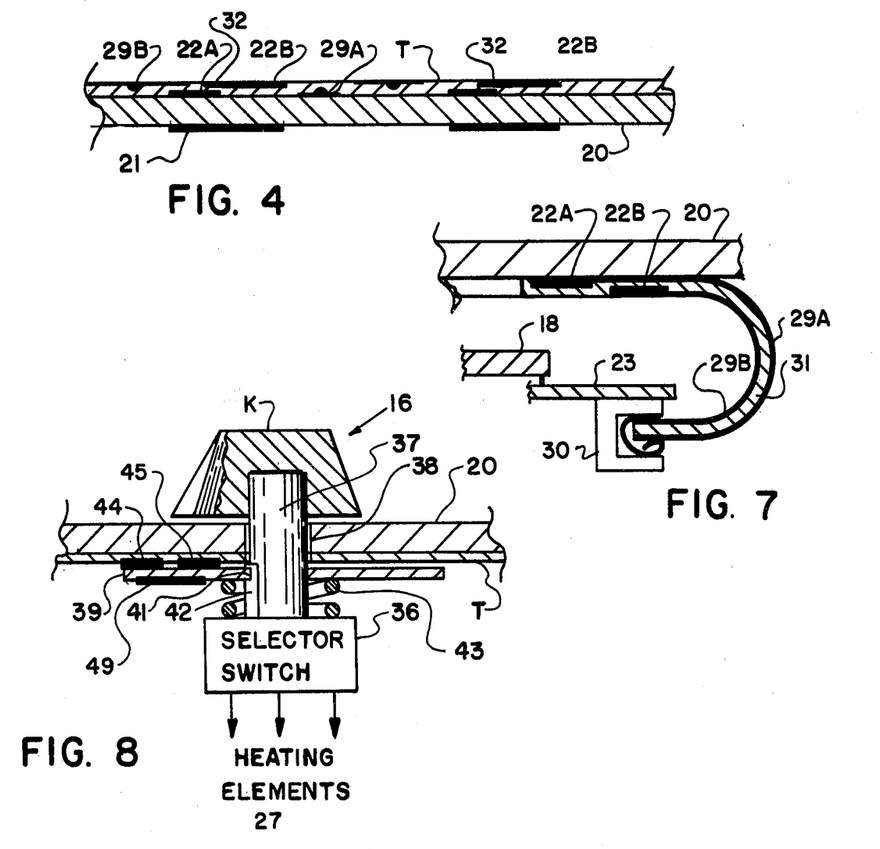
FIG. 4 is an enlarged, cross-sectional view of the touch panel taken along line 4—4 in FIG. 2 illustrating an external, touch capacitive plate and electrically conductive segments forming the internal capacitive plates, the segments being disposed on opposite sides of a flexible tape, each segment of the internal capacitive plates being disposed opposite an external touch plate and electrically in series with the external touch plates.
FIG. 7 is a partial cross-sectional view taken along line 7—7 in FIG. 2 illustrating the use of a portion of the panel backing film as a flexible cable for interconnecting the touch panel with an electrical circuit by means of a plug connector.
FIG. 8 is an enlarged cross-sectional view taken along lines 8—8 in FIG. 2 illustrating a capacitive type, oven Mode Selector Switch in greater detail.

As shown in FIGS. 3 and 4, each internal capacitive plate 22 is formed of two electrically conductive segments 22A and 22B that are disposed on opposite sides of the flexible tape T and positioned opposite the external plate 21 with which the internal segments 22A and 22B each cooperate to form a capacitor. The combined surface area of the segments 22A and 22B may be slightly larger than that of the external plate with which associated.

The electrically conductive segments 22A and 22B and interconnecting conductive paths 29A and 29B may be printed, screened, etched, or otherwise formed on the same side of the tape (FIG. 5) or upon opposite sides of the flexible tape (FIG. 4 - the preferred embodiment) using conventional techniques as is well known in the manufacture of printed circuits.

As can be seen, the conductive paths 29A and 29B required to interconnect the respective segments 22A and 22B of internal capacitive plates 22 with the electrical logic, control and display circuit (FIG. 11) are also disposed on opposite sides of the tape T.

As shown in FIGS. 2, 3 and 7 the conductive paths 29A and 29B may be brought out in the form of one or more relatively narrow, flat, flexible cables 31 as required. As shown, the conductive paths 29A and 29B are disposed along the opposite sides and edges of the cable 31. Positive electrical connections between the internal capacitive plates 22A and 22B and the printed circuit board 23 for instance, is effected by means of a commercially available, flat, electrical cable connector 30 such as manufactured by Molex, 18200 Miles Avenue, Cleveland, Ohio.

The arrangement of the segments 22A and 22B on opposite sides of the tape T as in the preferred embodiment offers certain advantages. For instance, since there are fewer segments on each side of the tape, there are fewer conductive paths required on each side of the tape T for a given size of touch entry keyboard. Therefore, the need for providing electrical cross overs for the interconnecting conductive paths, 29A and 29B, as would be required if all were disposed on the same side of the tape T, can be eliminated.

Further, by disposing the conductive paths 29A and 29B on opposite sides of the tape T, greater freedom is permitted in laying out the most desirable and preferably the shortest conductive paths. This, as will be explained, minimizes the effects of stray capacitance $C_s$ caused by longer, more complex, and/or closely coupled conductive paths that may tend to occur when the circuitry is all formed on one side of the tape, particularly with larger touch panels.

The effects of body capacitance ($C_b$) and stray input capacitance $C_s$ on switch plate size and the design and operation of touch entry, capacitive switching systems are generally known. Such parameters directly affect the change in the level of output signal from the capacitive switch that occurs when an untouched switch is touched and vice versa. It is this change in output signal level that is sensed and utilized by the electronic logic, control and display circuitry. For a detailed description of the operation of capacitive switches, see the AMI Application Note referred to previously. In the event the external capacitive plates 21 are not provided, the user serves as a capactive plate when a designated surface portion on the panel is touched. Loading the capacitive switch thus completed to ground and changing the level of an output signal from that particular switch.

The size or surface area of the external plate 21 of the capacitive switch 19 is directly related to its required capacitance $C_p$. In conventional capacitive switch operation, the change in signal level to be sensed when an external capacitive plate is touched is calculated to permit acceptable operation over a range of stray input capacitance valves $C_s$ which is reflected by such factors as undesirable circuit coupling and the related difference in length between the longest and shortest conductive paths interconnecting the respective capacitive segments 22A and 22B.

Since the stray input capacitance $C_s$ for each switch varies in accordance with the length and intercoupling between the interconnecting conductive paths as can be seen from the noted disclosure, the resulting change in output signal level when a respective switch is touched varies from switch to switch. As generally it is this change in output signal level that is sensed by the logic circuitry, it has been found desirable that both the absolute value and change in output signal level as maintained substantially the same for each switch operation.

A feature of this invention is to accomplish this by the use of capacitive trim means or tabs 32 (FIG. 3). This is achieved by adding a value of trim capacitance $C_t$ to each switch, $C_t$ being substantially equal to the difference between the highest $C_s$ for any switch 19 on the panel and the $C_s$ for a given switch.

A preliminary pattern is printed having conductive paths 29A and 29B on the flexible tape T, with each trim tab 32 initially of the same size and integrally formed as a part of each segment 22B on the tape T. The tab size and dimensions are determined to provide a trim capacitance $C_t$ max between the respective segments 22A and 22B equal to the difference between the largest and smallest stray capacitance values $C_s$ occurring between any two switches in a given panel layout, $C_t$ max being attributable to the coupling and length of the interconnecting conductive paths on the tape T.

After the flexible tape T is affixed to the dielectric panel 20 by means of a non-conductive adhesive or the like, each trim tab 32 for each switch $S_1 \ldots S_n$ may then be trimmed to provide for substantially the same total capacitance $(C_s + C_t)$ at each switch $S_1 \ldots S_n$ where $C_s + C_t$ equals the largest value of $C_s$ at any switch on the panel.

Therefore, any charge in output signal level as affected by stray capacitance $C_s$ will be the same for every switch on a given touch entry panel. Thus, the change in output signal level sensed by the microprocessor 24 will also be substantially the same.

While the addition of the trim capacitance $C_t$ in some instances tends to lower the change in output signal level at some switches for a given applied signal voltage, the use of trim tabs 32 permits the controlled minimization of the effects of noise and variation in both stray input capacitance $C_s$ and to a smaller degree body capacitance $C_b$ of the user. These factors are believed more significant in achieving precise, reliable operation of the control system than the slight reduction in overall change in output signal level that results from trimming to the worst stray capacitance $C_s$ condition at all switch positions.

As previously noted, the use of the flexible backing tape T with the internal capacitive segments 22A and 22B disposed on its opposite sides permits for greater flexibility in laying out the requisite circuits initially thus reducing the stray capacitance $C_s$ in the worst case for the system. Once the tabs 32 of a flexible tape T for a given sized panel are trimmed to the desired signal balance for the electronic logic, control and display circuitry with which used, all other flexible tapes T for the same size panels, including the trim tabs 32 can be printed in a final configuration prior to affixing them to the dielectric panels. No trimming is required thereafter.

An important feature of the invention is that the conductive paths 29A and 29B may be brought out for connection to the printed circuit board 23 by means of one or more flexible cables 31 integrally formed as a part of the flexible tape T as required for any given touch panel design.

Figure 5:
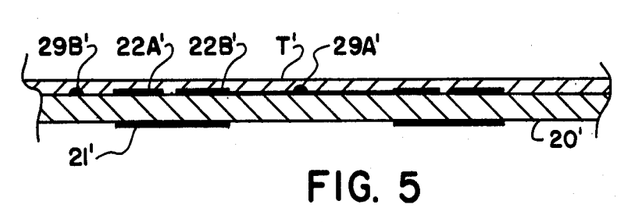
FIG. 5 is a cross-sectional view of an alternative embodiment of the invention wherein the internal capacitive plates are disposed on the same side of a non-conductive, flexible tape.

Another advantage obtained in positioning the segments 22A and 22B of each internal capacitive pad 22 on opposite sides of the flexible tape T, is that the segments 22A and 22B are always insulated from each other by the thickness of the tape T. This can simplify the tape fabrication required as when all internal capacitive pad segments 22A' and 22B' are formed on the same side of the tape T' as shown in FIG. 5.

Figure 6:
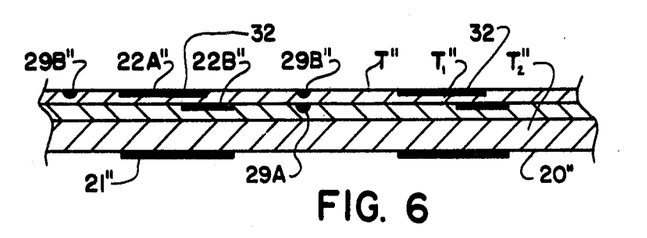
FIG. 6 is a partial, cross-sectional view of an alternative embodiment of the invention wherein a flexible, nonconductive, panel backing tape is formed of two or more flexible films, the internal capacitive plate segments and electrical connections thereto being disposed on opposite sides of one or more of the flexible film.

FIG. 6 illustrates yet another alternative embodiment of the invention wherein the flexible tape T" is formed of two flexible films $T_1"$ and $T_2"$ of nonconductive plastic secured together by means of a non-conductive adhesive. The tape T" is also secured to the back of the panel 20" with the segments 22A" and 22B" forming each internal capacitive pad 22" positioned opposite an external switching pad 21" on the outside surface of the panel 20".

The use of two or more flexible, plastic films $T_1"$ and $T_2"$ to form the tape T" provides four or more rather than two surfaces upon which to form the respective internal capacitive plate segments 22A" and 22B" and the conductive paths required to interconnect respective segments to each other and to the external electrical logic, control and display circuitry. A flexible cable 31" may also be integrally formed as a part of the tape T" for connecting the keyboard into the control system.

This arrangement permits an even greater dispersal of conductive paths 29A" and 29B", facilitating the design and layout of even larger, touch entry panels 20" having a greater number of external capacitive switching plates 21".

while FIGS. 3, 4 and 6 illustrate the use of trim tabs 32 and 32" integrally formed as a part of capacitive segments 22B and 22B", other trim tab means 51 (FIG. 3) in the instances where internal capacitive segments 22A and 22B and 44 and 45, are on the same side of the tape T as in FIG. 6 and may be provided to accomplish the same purpose in the same manner. Trim means 32 and 51 may be spaced from the respective segments 22A and 22B and 44 and 45.

In all embodiments of the invention described thus far, the use of a flexible tape T, T' and T" as described herein offers other advantages in the design, layout and fabrication of capacitive switching touch entry panels. Being of a nonconductive, flexible, plastic material the tapes T, T' or T" strengthen the respective panels 20, 20' and 20" and serve to make them substantially shatter proof.

This offers a cost advantage as it permits the safe use of untempered rather than tempered glass if desired. The flexible panel backing tape also serves to insulate the internal electronic circuitry from ambient temperatures, a potential advantage when the panel is used in a hostile environment such as when it serves as the back panel of a conventional cooking range. Also, all color coatings and identifying indicia to be displayed on the front panels 20, 20' or 20" can be arranged on the flexible backing tapes permitting the use of a clear glass if desired.

DISPLAY

The display 18 may be a commercially available four digit, seven segment numerical type device for displaying the timing functions described on the front panel as shown in the aforementioned Prior Art Patents.

TEMPERATURE CONTROL SWITCH

Oven Temperature Control Switch 28 may be a commercially available electric oven thermostatic device such as Model Number BTP-311-37 manufactured by Robertshaw Controls Company, 1701 Byrd Avenue, Richmond, Virginia.

MODE SELECTOR SWITCH

In control systems for appliances and other devices, there is a need to get information other than keyboard signals into the electronic controls. For example, in the control system of this invention, it is necessary to use a Mode Selector Switch for connecting the Bake and Broil Heating elements to the power supply in order to perform the selected cooking operation, including Timed Bake, Clean and Off.

In providing for programmed cooking operation as in this invention, it is essential that the position of the Mode Selector Switch 16 is communicated to the electronic logic control, and display circuitry. For instance, it may be required to reset the Stop Time and Cook Time when the Mode Selector Switch 16 is in any position other than Timed Bake.

While additional mechanical switches operated by a conventional selector switch shaft may be employed to communicate the position of the selector switch to an electronic control system, the use of printed circuits on the flexible, non-conductive backing tapes T, T' or T" in accordance with this invention permits the use of a novel, capacitive type Mode Selector Switch 16 as shown in FIGS. 5, 2, 3 and 7.

In doing so, the invention incorporates the desired switching functions of the Mode Selector Switch and its contact elements and connecting circuits as a part of the flexible tape already available as a part of the keyboard panel. This provides all of the Mode Selector Switch elements except an actuator mounted on a rotary disc and all interconnections to the electronic control system.

As shown in the drawings the Mode Selector Switch 16 includes a multiple position (Off, Bake, Timed Bake and Clean) selector switch 36 for connecting the electrical oven heating elements to typically a 220V AC power supply. The Mode Selector Switch 16 operates in unison with the rotary switch 36 operated by a shaft 37 that passes through an aperture 38 in the panel 20 and which is rotated by selector knob K. Such selector switches are well known, commercially available and need not be described in further detail.

The shaft 37 is fixedly secured in its axial position and slidably supports an insulated disc 39 provided with a key 41 that is received in a longitudinal way 42 formed in the shaft 37. The disc 39 is urged against the flexible tape T affixed to the back or internal surface of the glass panel 20 as previously described by means of a coiled spring 43 or the like.

The flexible tape T includes a pair of electrically conductive capacitive plates 44 and 45 radially spaced around the shaft, one pair of plates for each position of the Mode Selector Switch 16. It is to be understood that the plates 44 and 45 may be formed on either side of the tape T. The inner plates 45 are connected in common and brought out to a plug connector 30 by a single conductive path 47 while the outer plates are brought out on individual conductive path 48, all capacitive plates 44 and 45, conductive paths 47 and 48, and the flexible connector cable 31 being formed on the flexible tape T. Insulated disc 39 is provided with a radially extending electrically conductive capacitive plate 49 that bridges without touching the capacitive plates 44 and 45 on the flexible tape T at each switch position as the knob K is rotated. This produces a change in capacitance and output signal level which is sensed by the electronic logic and control circuitry. Trim tabs 51 (FIG. 3) for the same purpose as trim tabs 32 previously described are integrally formed on segments 44 and extend adjacent to but do not touch the segments 45. This same trim tab arrangement may also be used with the embodiment shown in FIG. 5 or other instance where the capacitive segments are disposed on the same side of a tape. Further the trim tabs needn't be connected to either segment to effect the intended function.

Figure 9:
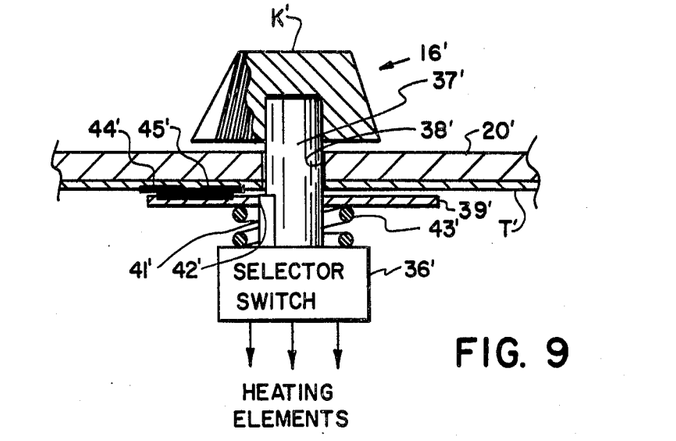
FIG. 9 is a cross-sectional view of an alternative embodiment of an oven Mode Selector Switch.

FIG. 9 illustrates an alternative embodiment of the selector switch 16' that provides for an ohmic rather than capacitive switch operation, the disc 39' being turned over so that the conductive plate 49' completes an electrical circuit between the plates 44' and 45'. This switch operation is also sensed and utilized by the electronic control circuit.

Figure 10:
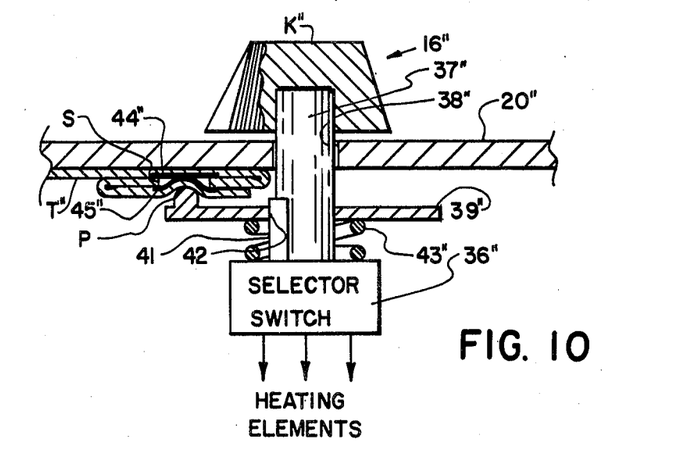
FIG. 10 is a cross-sectional view of yet another alternative embodiment of an oven Mode Selector Switch.

FIG. 10 offers yet another alternative embodiment of a selector switch 16" in which the edge of the flexible tape T" encircling the shaft is folded upon itself in the form of an S configuration. Electrically conductive segments 44" and 45" at each switch position are disposed opposite each other on the flexible tape T" and separated by a thickness of the non-conductive, flexible tape T". A slot S in the tape T" at each selector switch position permits the opposed conductive segments 44" and 45" to be brought together when a projection P formed on a rotatable, spring biased disc 39" reaches each slot S thus effecting an ohmic switch operation.

The electrical connections between all three embodiments of the Mode Selector Switch 16 and the electronic circuitry is the same, utilizing the flexible tape T to provide the capacitive and contact elements of the switches as well as the conductive paths and flexible cable for connecting the selector switches into the system as shown in FIG. 11.

DESCRIPTION OF OPERATION

The operations of Bake and Broil are provided for by turning the Mode Selector Switch 16 to the desired position, and setting the Temperature Selector Switch 17.

TIMED BAKE OPERATION

This is the same as the untimed operation except the Mode Selector Switching is first turned to Timed Bake. Then the Cook Hours plate and the numerical plates representative of the desired cooking time in hours and minutes are touched followed by the Start plate. In the event it is desired to start a Timed Bake operation sometime later, the user follows the same procedure except the Stop Time plate is touched and the desired Stop Time inserted into the program by touching the requisite external numerical switch plates before touching the Start plate. The microprocessor 24 is arranged to calculate the time to turn on the oven in order to complete the desired Bake operation and turn off the oven at the selected Stop Time.

Upon completion of each acceptable keystroke, the tone generator 25 is actuated to apprise the user of same. This provides an auditory simulation of a tactile sensation for each switch operation. In the event a Timed Bake operation cannot be completed in accord with the program entered, the oven remains off and the display flashes a warning.

The actual time of day maintained by the microprocessor 24 is available on the display by touching the Clock plate. For timing short intervals of an hour or so, other than Timed Bake, the Minute (Min.) Timer Plate is touched and the desired time interval entered by touching the requisite numerical plates followed by touching the Start plate. The tone generator 25 provides a timed pulsing signal upon expiration of the selected interval. These timing functions are generally known and the electronic circuitry for providing same need not be described in further detail.

It is to be understood an entire appliance control system including temperature and mode instructions, could be performed by incorporating such functions into a capacitive, touch entry panel in accordance with the invention. Further, the control system and panel need not be restricted to use with domestic cooking ranges and appliances but may find application in any system for operating a device in accordance with a program of digital or other logic entered into the system by means of capacitive switching means on a touch entry panel of the type herein described.

Similarly, the Mode Selector Switch and the alternative embodiments thereof may find application apart from the control system and panel described herein.

Figure 12:
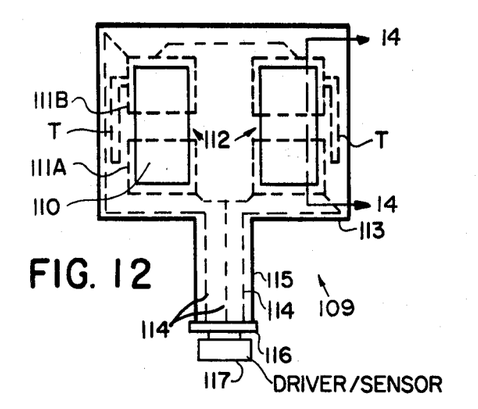
FIG. 12 is a front plan view of another embodiment of a flexible capacitive switch and panel in accordance with the principles of the invention.
Figure 13:
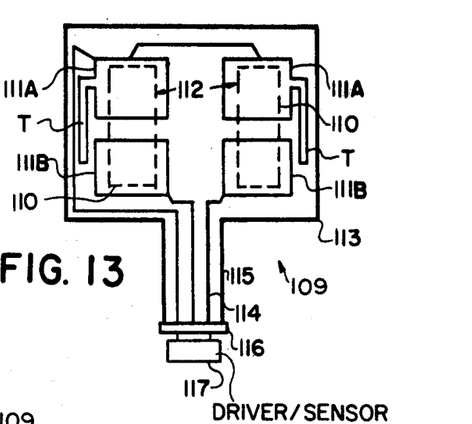
FIG. 13 is a rear plan view of the invention illustrated in FIG. 12.
Figure 14:
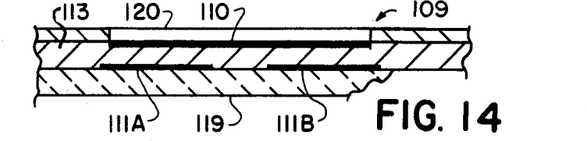
FIG. 14 is a partial cross-sectional view taken along the line 14—14 in FIG. 1 illustrating the invention affixed to a non-conductive backing surface.

Referring to the drawing, FIGS. 12-14 illustrate another embodiment of a flexible, touch operated capacitive switch panel 109 in accordance with the invention. External electrically conductive capacitive touch plates 110, and two pair of internal, electrically conductive drive and sense plates 111A and 111B form two capacitive switches generally designated by the reference numeral 112. All plates 110 and 111A and 111B comprising the switches 112 are formed on a single, flexible sheet 113 of dielectric material such as mylar tape or the like.

Conductive paths 114 connecting the electrically conductive capacitive plates 110 and 111A and 111B are brought out on a narrowed tail integrally formed on the tape that serves as a flexible connector cable 115. A commercially available, flat cable connector 116 permits the panel 109 to be connected to suitable electronic circuit means 117 arranged to apply drive signals and sense and utilize the actuation of the respective capacitive switches 112 as is well known and described in detail in the reference cited in the Prior Art Statement.

The electrically conductive capacitive plates 111A and 111B and interconnecting circuits 114 may be formed on the flexible tape 113 by silk screening, etching, or other means as well known, a pair of the internal plates 111A and 111B forming each switch 112 being oppositely disposed from an external touch plate 110.

Electrically, the panel 109 is arranged so that each plate 111A and 111B forms a capacitor with the plate 110 disposed on the opposite side of the tape 113, the two capacitors thus formed being in series electrically. Thus, a signal applied to a drive plate 111A is loaded to ground when the external plate 10 is physically touched and thus conductively coupled to ground by a user. This lowers the level of the output signal at sense plate 111B. It is this change in level of the output signal that is sensed by the electronic circuit means 117 signifying a switch operation.

As shown in FIG. 13, each switch 112 may be provided with capacitive trim tabs T for as previously described the effects of stray capacitance $C_s$ caused by coupling between interconnecting circuits and producing variations in the change of output signal levels for different switch actuations, is eliminated.

By properly trimming the individual tabs T, all switches 112 on the entire keyboard 9 can be balanced to compensate for any differences in stray capacitance $C_s$ from switch to switch. The change in output signal level upon the actuation of each switch 112 thus becomes substantially constant regardless of differences in stray capacitiance $C_s$ at the respective switches as explained in greater detail in the aforementioned co-pending patent application.

Typically, and is as well known, the operation of each capacitive switch 112 is as follows: drive pads 111A are driven with a signal from the electronics circuit 117 which may be a microprocessor or other suitable signal source.

The applied signal enters each touch pad 110 from a drive paid 111A and exits through an associated sense pad 111B. This continues until a pad 110 is touched by an operator grounding same. This greatly reduces the level of the signal from sense pad 111 which is detected by the electronic circuit means 117 signifying a switch operation.

If desired, the electronically conductive capacitive plates 110, 111A and 111B and conductive paths 114 may be deposited on a clear tape 113 by the sputtering or vapor deposition of transparent films of gold or other suitable electrically conductive material. Thus, the entire touch switching panel 109 can be made transparent except for any desired indicia, legends, and designs which may be applied using any suitable non-conductive paint. The unitary capacitive touch panel 109 thus formed may be used by affixing it to any suitable backing member 119, formed of non-conductive material by means of a non-conductive adhesive.

Figure 15:
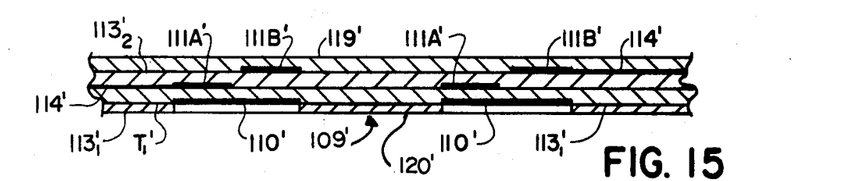
FIG. 15 is a partial cross-sectional view illustrating an alternative embodiment of the invention shown in FIGS. 12-14 in which the capacitive plates forming the respective capacitive switches are disposed on two sheets of tape to form the flexible panel.

FIG. 15 illustrates an alternative embodiment of the invention shown in FIGS. 12–14 wherein a flexible panel 109' is formed of two sheets of a dielectric material such as mylar tape $113_1'$ and $113_2'$ or the like, affixed together by means of a non-conductive adhesive. The internal capacitive segments or plates 111A' and 111B' as well as the electrically conductive paths 114' connected thereto are disposed on opposite sides of tape $113_2'$. Touch plates 110' are formed on tape $113_1'$. Thus, the capacitive plates 111A' and 111B' of each switch 112' are separated by the thickness of tape $113_2'$; and from plates 110' by the thickness of tape $113_2'$.

With this arrangement, compared to that in FIGS. 12–14 connecting circuits 114' on the tape $T_2'$, when a plurality of switches 112' are disposed on a single panel 109', can be shortened as cross overs are eliminated. In this instance, connecting circuits 114' are brought out on opposite sides of a strap 115' that forms a flexible cable permitting a plug connection to the electronic circuit 117'.

The flexible panel 109', may also be similarly affixed to a non-conductive backing member 119'. A protective, transparent and non-conductive coating of glass or of flexible dielectric material 120 or 120' may also be applied to the front face of the flexible panels 109 or 109' respectively around the touch plates 110 and 110' to protect the panel from wear.

Figures 16, 17, 18:
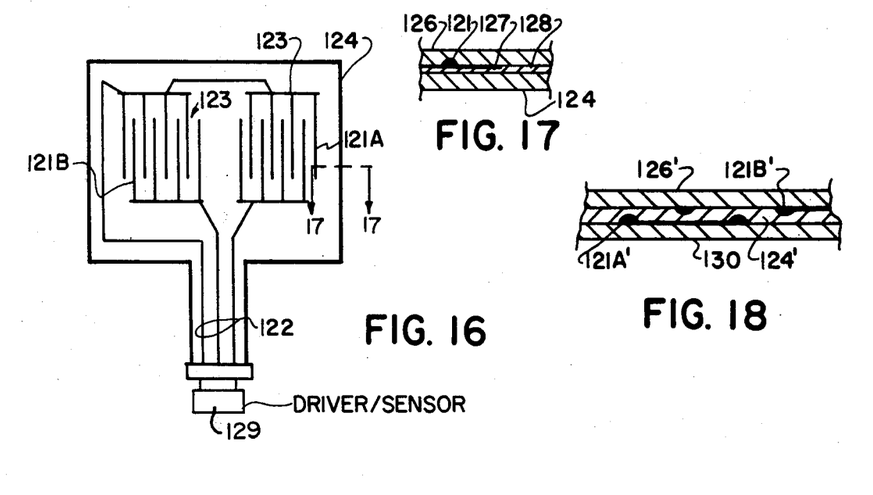
FIG. 16 is a rear view of still another alternative embodiment of the invention in which the flexible panel is formed of a single tape and all capacitive switch plates and interconnecting electrical circuitry are formed on the same side of the tape.
FIG. 17 is a partial, cross-sectional view taken along lines 17-17 in FIG. 16 illustrating the method of applying markings, background coloring and the capacitive switch elements and conductive plates on the same side of a flexible tape.
FIG. 18 is a partial, enlarged cross sectional view of an alternative embodiment of the invention shown in FIG. 17 wherein the interleaved capacitive plates are formed on opposite sides of a flexible panel of dielectric material.

Referring now to FIGS. 16 and 17, yet another alternative embodiment of the invention is disclosed in which all of the capacitive plates 121A and 121B and interconnecting circuits 122, for a pair of fringe effect capacitive switches 123 are disposed on the same side of a panel 124 formed of a flexible dielectric material such as mylar or the like.

Thus, as in the case of the invention previously described, an entire capacitive switch touch panel 124 with connecting electrical circuits can be formed on a single flexible sheet of dielectric material. The flexible touch panel 124 may be affixed to a backing member 126 of non-conductive material such as paperboard or the like or supported in a suitable frame. When fabricating the touch panel from a transparent dielectric sheet 124 identifying indicia 127 for each switch 123 such as numbers, letters or other symbols are first applied to the back side of the flexible panel 124 using any suitable con-conductive paint or the like.

If a background color is required, this too is applied to the back side of the panel 124 using a non-conductive coat of paint around the identifying indicia (as shown in FIG. 17) or over the entire back surface.

Thereafter the electrically conductive interdigital capacitive plate elements 121A and 121B and interconnecting conductors 122 are printed, silk screened, or etched on the painted surface of the panel 124. The completed flexible panel 124 may be used by affixing it to the non-conductive backing panel 126 using a non-conductive adhesive. The printed switches 123 are thus protected from exposure to the operator or elements by the thickness of the panel 124 to the front and from the rear by the backing member 126 if employed. Only a smooth, durable touch surface is exposed to the operator.

When the smooth surface of the panel 124 opposite the interdigital capacitive plates 121A and 121B is touched, the switch is capacitively coupled to ground, the operators finger serving as a grounded capacitive plate. This sharply decreases the switch capacitance causing a change in signal level which is detected by suitable electronic circuit means 129 indicating a capacitive switch operation as is well known.

While the capacitive plates 121A and 121B have been shown as straight relatively narrow interdigital members, the number and surface area of each pattern may be varied to configuration giving the desired switch capacitance and change in signal level when actuated. And, the panel 124 may be fabricated to provide a plurality of switches 123 on a single flexible dielectric sheet in any desired switch matrix.

The interdigital members of capacitive places 121A and 121B may also be printed or otherwise formed on opposite sides of a flexible, dielectric tape 124' as shown in FIG. 7, an enlarged, parital cross-sectional view of such an alternative embodiment. The completed touch panel 124' can also be used by affixing it to any non-conductive backing member 126' by means of a non-conductive adhesive or the like. The exposed capacitive members plate 121A' are then covered with a second transparent flexible tape 130 bearing any desired indicia on the inside surface. The tape 130 is also secured to the tape 124' by means of a non-conductive adhesive.

While a preferred and a number of alternative embodiments of the invention have been described in detail, numerous changes and modifications can be made within the principles of the invention which is to be limited only by the scope of the appended claims.

What is claimed is:

1. A user, touch actuable capacitive switch panel for changing the level of an output signal to an electrical circuit means comprising: a first dielectric panel having a plurality of external, user touchable capacitive plates formed thereon arranged as a keyboard;

a second flexible dielectric panel having a plurality of pairs of internal capacitive plates formed thereon affixed to said first dielectric panel, two internal capacitive plates forming each pair of capacitive plates being oppositely disposed from one of said external capacitive plates on opposite sides of said second flexible dielectric panel forming a plurality of capacitive switches on said switch panel;

electrically conductive paths formed on said second flexible dielectric panel for interconnecting said internal capacitive plates to said electrical circuit means;

and trim means formed on said second flexible dielectric panel for adjusting the change of level of the output signal upon actuation of each of said capacitive switches.

2. A capacitive switch as defined in claim 1 wherein said first dielectric panel is transparent and said second flexible dielectric panel has colored surfaces and identifying indicia thereon.

* * * * *